(12) United States Patent
Zheng et al.

(10) Patent No.: US 8,895,157 B2
(45) Date of Patent: Nov. 25, 2014

(54) HOST MATERIAL FOR LIGHTING DEVICES

(75) Inventors: Shijun Zheng, San Diego, CA (US); Rebecca Romero, Escondido, CA (US); David T. Sisk, San Diego, CA (US)

(73) Assignee: Nitto Denko Corporation, Osaka (JP)

( * ) Notice: Subject to any disclaimer, the term of this patent is extended or adjusted under 35 U.S.C. 154(b) by 379 days.

(21) Appl. No.: 13/360,639

(22) Filed: Jan. 27, 2012

(65) Prior Publication Data

US 2012/0193614 A1  Aug. 2, 2012

Related U.S. Application Data

(60) Provisional application No. 61/438,537, filed on Feb. 1, 2011.

(51) Int. Cl.
| | | |
|---|---|---|
| H01L 51/54 | (2006.01) | |
| H01L 51/00 | (2006.01) | |
| C09K 11/06 | (2006.01) | |
| H05B 33/14 | (2006.01) | |
| H01L 51/50 | (2006.01) | |

(52) U.S. Cl.
CPC ......... *H01L 51/0085* (2013.01); *H01L 51/5012* (2013.01); *C09K 2211/1007* (2013.01); *C09K 2211/1029* (2013.01); *H01L 51/5016* (2013.01); *H01L 51/5072* (2013.01); *C09K 11/06* (2013.01); *H05B 33/14* (2013.01); *Y10S 428/917* (2013.01)

USPC .......... 428/690; 428/917; 313/504; 313/505; 313/506; 257/40; 257/E51.05; 257/E51.026; 257/E51.032; 548/304.1; 548/418; 548/440; 548/444

(58) Field of Classification Search
None
See application file for complete search history.

(56) References Cited

U.S. PATENT DOCUMENTS

| | | |
|---|---|---|
| 2009/0081803 A1 | 3/2009 | Gamsey et al. |
| 2011/0210658 A1 | 9/2011 | Pan et al. |

FOREIGN PATENT DOCUMENTS

| | | |
|---|---|---|
| JP | 2007084458 A | 4/2007 |
| JP | 2008120696 A | 5/2008 |
| JP | 2009035524 A | 2/2009 |
| JP | 2010090084 A | 4/2010 |
| WO | 2009009756 A2 | 1/2009 |
| WO | 2011097137 A1 | 8/2011 |

*Primary Examiner* — Gregory Clark
(74) *Attorney, Agent, or Firm* — Law Office of Katsuhiro Arai (57) ABSTRACT

Optionally substituted bispyridinylbenzene compounds useful in light-emitting devices include, but are not limited to, 1,3-bis(5-(9H-carbazol-9-yl)pyridin-3-yl)benzene and 9,9'-(5,5'-(5-methyl-1,3-phenylene)bis(pyridine-5,3-diyl))bis (9H-carbazole).

10 Claims, 1 Drawing Sheet

HOST MATERIAL FOR LIGHTING DEVICES

CROSS-REFERENCE TO RELATED APPLICATIONS

This application claims the benefit of U.S. Provisional Application No. 61/438,537, filed Feb. 1, 2011, and the disclosure of which is herein incorporated by reference in its entirety.

BACKGROUND OF THE INVENTION

1. Field of the Invention

The present invention generally relates to a field of organic chemistry and organic light emitting diode materials. More specifically, the present invention is the development of a host material.

2. Description of the Related Art

Organic light-emitting devices (OLEDs) have been widely developed for flat panel display, and are moving fast towards solid state lighting (SSL) applications. It is generally considered that a white OLED device needs to achieve power efficiency >100 lm/w with color rendering index (CRI)>70 and operating time >10,000 hours @ 1000 cd/cm$^2$ to be qualified as SSL applications. In order to improve the power efficiency of OLED devices and extend the operational lifetime, development of high performance host materials with high T1 energy and high bipolar mobilities is necessary.

Thus there is a need for a host material exhibiting improved power efficiency for use in OLED devices.

SUMMARY OF THE INVENTION

Some embodiments are related to a compound represented by a formula:

wherein $R^1$, $R^2$, $R^3$, and $R^4$ are independently selected from H, —CH$_3$, and —C$_2$H$_5$; and Bz$^1$ and Bz$^2$ are independently selected from optionally substituted carbazolyl, optionally substituted diphenylamine, and optionally substituted phenylnaphthylamine.

Some embodiments provide an organic light-emitting device comprising an organic component disposed between an anode and a cathode, wherein the organic component comprises a compound described herein. In some embodiments, the organic component further comprises at least one layer comprising the compound, wherein the layer is selected from: an electron-transport layer, an electron-injecting layer, and an electron-injecting and electron-transport layer.

These and other embodiments are described in greater detail below.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DETAILED DESCRIPTION OF THE PREFERRED EMBODIMENT

Unless otherwise indicated, when a chemical structural feature such as phenyl is referred to as being "optionally substituted," it includes a feature which may have no substituents (i.e. may be unsubstituted) or which may have one or more substituents. A feature that is "substituted" has one or more substituents. The term "substituent" has the ordinary meaning known to one of ordinary skill in the art. In some embodiments, the substituent includes an ordinary organic moiety known in the art, which may have a molecular weight (e.g. the sum of the atomic masses of the atoms of the substituent) of less than: about 500 g/mol, about 300 g/mol, about 200 g/mol, about 100 g/mol, or about 50 g/mol. In some embodiments, the substituent comprises: about 0-30, about 0-20, about 0-10, or about 0-5 carbon atoms; and about 0-30, about 0-20, about 0-10, or about 0-5 heteroatoms independently selected from: N, O, S, P, Si, F, Cl, Br, I, and combinations thereof; provided that the substituent comprises at least one atom selected from: C, N, O, S, P, Si, F, Cl, Br, and I. Examples of substituents include, but are not limited to, alkyl, alkenyl, alkynyl, carbazolyl, aryl, heteroaryl, heteroalicyclyl, aralkyl, heteroaralkyl, (heteroalicyclyl)alkyl, hydroxy, protected hydroxy, alkoxy, aryloxy, acyl, ester, mercapto, alkylthio, arylthio, cyano, halogen, carbonyl, thiocarbonyl, O-carbamyl, N-carbamyl, O-thiocarbamyl, N-thiocarbamyl, C-amido, N-amido, S-sulfonamido, N-sulfonamido, C-carboxy, protected C-carboxy, O-carboxy, isocyanato, thiocyanato, isothiocyanato, nitro, silyl, sulfenyl, sulfinyl, sulfonyl, haloalkyl, haloalkoxyl, trihalomethanesulfonyl, trihalomethanesulfonamido, and amino, including mono- and di-substituted amino groups, and the protected derivatives thereof. In some embodiments, the substituent may be selected from F, Cl, Br, I, NO$_2$, —CN, —CNO, —NCO, R', —OR', —COR', —CO$_2$R', —OCOR', —NR'COR", CONR'R", —NR'R", wherein each R' and R" is independently H, optionally substituted phenyl, C$_{1-12}$ alkyl, or C$_{1-6}$ alkyl.

As used herein the term "aryl" has the ordinary meaning understood by a person of ordinary skill in the art, and may include an aromatic ring or aromatic ring system such as phenyl, naphthyl, etc.

As used herein, the term "alkyl" has the ordinary meaning understood by a person of ordinary skill in the art, and may include a moiety composed of carbon and hydrogen containing no double or triple bonds. Alkyl may be linear, branched, cyclic, or a combination thereof, and in some embodiments, may contain from one to thirty-five carbon atoms. Examples of alkyl groups include but are not limited to $CH_3$ (e.g. methyl), $C_2H_5$ (e.g. ethyl), $C_3H_7$ (e.g. propyl isomers such as propyl, isopropyl, etc.), $C_3H_6$ (e.g. cyclopropyl), $C_4H_9$ (e.g. butyl isomers) $C_4H_8$ (e.g. cyclobutyl isomers such as cyclobutyl, methylcyclopropyl, etc.), $C_5H_{11}$ (e.g. pentyl isomers), $C_5H_{10}$ (e.g. cyclopentyl isomers such as cyclopentyl, methylcyclobutyl, dimethylcyclopropyl, etc.) $C_6H_{13}$ (e.g. hexyl isomers), $C_6H_{12}$ (e.g. cyclohexyl isomers), $C_7H_{15}$ (e.g. heptyl isomers), $C_7H_{14}$ (e.g. cycloheptyl isomers), $C_8H_{17}$ (e.g. octyl isomers), $C_8H_{16}$ (e.g. cyclooctyl isomers), $C_9H_{19}$ (e.g. nonyl isomers), $C_9H_{18}$ (e.g. cyclononyl isomers), $C_{10}H_{21}$ (e.g. decyl isomers), $C_{10}H_{20}$ (e.g. cyclodecyl isomers), $C_{11}H_{23}$ (e.g. undecyl isomers), $C_{11}H_{22}$ (e.g. cycloundecyl isomers), $C_{12}H_{25}$ (e.g. dodecyl isomers), $C_{12}H_{24}$ (e.g. cyclododecyl isomers), $C_{13}H_{27}$ (e.g. tridecyl isomers), $C_{13}H_{26}$ (e.g. cyclotridecyl isomers), and the like.

An expression such as "$C_{1-10}$" (e.g. "$C_{1-10}$ alkyl") or "$C_{6-10}$" (e.g. "$C_{6-10}$ aryl") refers to the number of carbon atoms in a moiety, and similar expressions have similar meanings. If a moiety is optionally substituted, such as "optionally substituted $C_{6-10}$ aryl," the designation of the number of carbon atoms such as "$C_{6-10}$" refers to the parent moiety only (e.g. the ring carbons of aryl) and does not characterize or limit any substituent on the moiety.

The structures of some of the optionally substituted ring systems referred to herein are depicted below. These ring systems may be unsubstituted, as shown below, or a substituent may independently be in any position normally occupied by a hydrogen atom when the ring system is unsubstituted.

Diphenylamine

Carbazolyl diphenylaminophenyl carbazolylphenyl

Carbazolyldiphenyl phenylnaphthylamino diphenylaminodiphenyl

The structures and names of some of the ring systems referred to herein are depicted below. If optionally substituted, these ring systems may be unsubstituted, as shown below, or a substituent may independently be in any position normally occupied by a hydrogen atom.

m-phenylene, 2,6-pyridinylene, 2,4-pyridinylene, 3,5-pyridinylene m-pyridinylene

With respect to m-pyridinylene, the term encompasses several isomers, three of which are depicted above.

o-phenylene    2,3-pyridinylene    3,4-pyridinylene

With respect to o-pyridinylene, the term encompasses several isomers, two of which are depicted above.

p-phenylene    2,6-pyridinylene    3,5-pyridinylene

With respect to p-pyridinylene, the term encompasses several isomers, two of which are depicted above

The term "low work function" has the ordinary meaning known to one of ordinary skill in the art. In some embodiments, a "work function" of a metal is a measure of the minimum energy required to extract an electron from the surface of the metal.

The term "high work function" has the ordinary meaning known to one of ordinary skill in the art, and may include a metal or alloy that easily injects holes and typically has a work function greater than or equal to about 4.5 eV.

The term "low work function metal" has the ordinary meaning known to one of ordinary skill in the art, and may include a metal or alloy that easily loses electrons and typically has a work function less than about 4.3 eV.

In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. In this disclosure, any defined meanings do not necessarily exclude ordinary and customary meanings in some embodiments. Further, in this disclosure, any ranges indicated may include or exclude the endpoints.

Some embodiments relate to compounds represented by at least one of Formula 1, Formula 2, Formula 3, Formula 4, Formula 5, Formula 6, Formula 7, Formula 8, and/or Formula 9, in conjunction with Formula a1, a2, a3, or a4, Formula b1, b2, b3, or b4, Formula c1 or c2, and Formula d1 or d2.

(Formula 1)

In Formula 1, $R^1$, $R^2$, $R^3$, and $R^4$ are independently selected from H, —$CH_3$, and —$C_2H_5$. $Hcy^1$ and $Hcy^2$ are independently selected from optionally substituted pyridinylene, and $Bz^1$ and $Bz^2$ are independently selected from optionally substituted carbazolyl, optionally substituted diphenylamine, and optionally substituted phenylnaphthylamine.

In some embodiments, the structure of Bz1-Hcy1 includes, but is not limited to, the following structures:

(Formula a1)

(Formula a2)

(Formula a3)

(Formula a4)

In some embodiments, the structure of Hcy2-Bz2 includes, but is not limited to, the following structures:

(Formula b1)

(Formula b2)

(Formula b3)

(Formula b4)

In some embodiments, Bz1 includes, but is not limited to, the following structures:

(Formula c1)

(Formula c2)

In some embodiments, Bz2 includes, but is not limited to, the following structures:

(Formula d1)

(Formula d2)

In some embodiments, the compound includes, but is not limited to, the following structures:

(Formula 2)

(Formula 3)

(Formula 4)

(Formula 5)

(Formula 6)

(Formula 7)

(Formula 8)

(Formula 9)

Some embodiments provide one of the compounds shown below:

9,9'-(5,5'-(5-methyl-1,3-phenylene)bis(pyridine-5,3-diyl))bis(9H-carbazole)

1,3-bis(5-(9H-carbazol-9-yl)pyridin-3-yl)benzene

With respect to any relevant formula above, $Hcy^1$ and $Hcy^2$ are independently optionally substituted pyridinylene. In some embodiments, pyridinylene is selected from o-pyridi- nylene, m-pyridinylene or p-pyridinylene. In some embodiments, o-pyridinylene is selected from 2,3-pyridinylene and 3,4-pyridinylene. In some embodiments, m-pyridinylene is selected from 2,6-pyridinylene, 2,4-pyridinylene, and 3,5-pyridinylene. In some embodiments p-pyridinylene is selected from 2,6-pyridinylene, 3,5-pyridinylene. In some embodiments, any substituent of $Hcy^1$ and $Hcy^2$ may independently be $R^1$, —$OR^1$, —$OC(=O)R^1$, —$CO_2R^1$, —$(C=O)R^1$, —$NR^2(C=O)R^1$, —$C(=O)NR^1R^2$, —$NR^1R^2$, F, Cl, Br, or I. In some embodiments, $Hcy^1$ and $Hcy^2$ are 3,4-pyridinylene or o-pyridinylene, and has 1 or 2 substituents independently selected from $R^1$ and —$OR^1$. In some embodiments, $Hcy^1$ and $Hcy^2$ may independently be unsubstituted 3,5-pyridinylene or unsubstituted o-pyridinylene. In some embodiments, $Hcy^1$ and $Hcy^2$ are independently 3,4-pyridinylene or m-phenylene, and have 1 or 2 substituents independently selected from $R^1$ and —$OR^1$. In some embodiments, $Hcy^1$ and $Hcy^2$ may independently be unsubstituted 3,5-pyridinylene or unsubstituted m-pyridinylene. In some embodiments, $Hcy^1$ and $Hcy^2$ are independently 3,5-pyridinylene or p-phenylene, and have 1 or 2 substituents independently selected from $R^1$ and —$OR^1$. In some embodiments, $Hcy^1$ and $Hcy^2$ are independently unsubstituted 3,6-pyridinylene or unsubstituted p-phenylene. In some embodiments, with respect to any relevant formula above, $R^5$, $R^6$, $R^7$, $R^8$, $R^9$, and $R^{10}$ are independently selected from H, optionally substituted $C_{1-6}$ alkyl and optionally substituted $C_{1-6}$—O-alkyl. In some embodiments, with respect to any relevant formula above, $R^5$, $R^6$, $R^7$, $R^8$, $R^9$, and $R^{10}$ are H.

Also with respect to any relevant formula above, $Bz^1$ and $Bz^2$ may independently be optionally substituted carbazolyl, optionally substituted diphenylamine, optionally substituted phenylnaphthylamine, optionally substituted carbazolylphenyl, optionally substituted diphenylaminophenyl, optionally substituted carbazolyl diphenyl and optionally substituted diphenylaminodiphenyl. In some embodiments, $Bz^1$ and/or $Bz^2$ are unsubstituted carbazolyl, or carbazolyl having 1, 2, 3, 4, 5, 6, 7, or 8 substituents, such as any substituent described above. In some embodiments $Bz^1$ and/or $Bz^2$ is unsubstituted diphenylamine, or diphenylamine having 1, 2, 3, 4, 5, 6, 7, 8, 9 or 10 substituents, such as any substituent described above. In some embodiments, the substituents of $Bz^1$ and $Bz^2$ may be independently selected from $CH_3$, $CH_2CH_3$, isopropyl, t-butyl, $CF_3$, F, Cl, Br, I, and $OCH_3$. In some embodiments, the substituents of $Bz^1$ and $Bz^2$ may be independently selected from H, optionally substituted $C_{1-6}$ alkyl and optionally substituted $C_{1-6}$—O-alkyl. In some embodiments, the substituents of $Bz^1$ and $Bz^2$ are H.

With respect to any relevant formula above, $R^1$, $R^2$, $R^3$, and $R^4$ are independently selected from H, —$CH_3$, and —$C_2H_5$. In some embodiments, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$, $R^{24}$, $R^{25}$, $R^{26}$, $R^{27}$, $R^{28}$ $R^{29}$ and $R^{30}$ is optionally any substituent. In some embodiments, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$, $R^{24}$, $R^{25}$, $R^{26}$, $R^{27}$, $R^{28}$ $R^{29}$ and $R^{30}$ may be independently selected from, the group consisting of H, F, Cl, Br, I, —CN, $C_{1-12}$ alkyl, $C_{1-6}$ alkyl, $C_{1-12}$ fluoroalkyl, $C_{1-6}$ fluoroalkyl, optionally substituted $C_{6-10}$ aryl and optionally substituted phenyl. In some embodiments, $R^1$ is selected from —$CH_3$ or H and $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$, $R^{24}$, $R^{25}$, $R^{26}$, $R^{27}$, $R^{28}$ $R^{29}$ and $R^{30}$ are H.

The compounds included in General Formula 1 can be synthesized based on a reaction scheme including, but not limited to, the following (General Reaction Scheme 1)

In some embodiments, carbazole, dibromopyridine, potassium carbonate, copper, and 18-crown-6 are dissolved in 1,2-dichlorobenzene, for example. The reaction mixture is degassed with argon and then heated to about 200° C. under argon. The reaction mixture is filtered and the solvent is removed. The resulting residue is purified by a silica gel column with 1:9 dichloromethane:hexanes as the eluent to yield the product as a white solid (Compound A). On the other hand, 1,3-dibromo-benzene, bis(pinacolato)diboron, Pd(dppf)Cl$_2$, and potassium acetate are dissolved in 1,4-dioxane, for example. The reaction mixture is degassed with argon and then heated to about 90° C. under argon, for example. The reaction mixture is filtered and an extraction is performed in ethyl acetate, for example. The organic phase is washed with water and then brine, then dried over magnesium sulfate, filtered, and concentrated, for example. The resulting residue is purified by a silica gel column with 1:4 ethyl acetate: hexanes as the eluent to yield the product as an off-white solid (Compound B). Compound A, Compound B, Pd(PPh$_3$)$_4$, and potassium carbonate are dissolved in a mixture of 1,4-dioxane and water. The reaction mixture is degassed with argon and then heated to about 90° C. under argon. The reaction mixture is filtered and an extraction is performed in ethyl acetate. The organic phase is washed with water and brine. The extract is dried over sodium sulfate, filtered and concentrated. The resulting residue is purified by a silica gel column with 1:4 ethyl acetate:hexanes as the eluent. The solvents are removed and the product is recrystallized from dichloromethane/hexanes to yield the product as an off-white solid (Compound C, final product).

By selecting the starting materials according to the final compound, any desired final compounds can be obtained. Any other derivatives can be synthesized via schemes similar to the above. In the present disclosure where conditions and/or structures are not specified, the skilled artisan in the art can readily provide such conditions and/or structures, in view of the present disclosure, as a matter of routine experimentation.

The compounds and compositions described herein can be incorporated into light-emitting devices in various ways. For example, an embodiment provides an organic component disposed between, and electrically connected to, an anode and a cathode. The organic component comprises the compounds and/or compositions described herein. In some embodiments, the total thickness of the emissive, hole transport, and emissive layers is about one-quarter (or about 20% to about 35%) of the emissive wavelength, e.g., if the emissive wavelength is about 450 nm, the total thickness of the plurality of layers (emissive layer[s], hole transport and electron transport layers) is about 100 to about 150 nm.

The anode may be a layer comprising a conventional material such as a metal, mixed metal, alloy, metal oxide or mixed-metal oxide, conductive polymer, and/or an inorganic material such as carbon nanotube (CNT). Examples of suitable metals include the Group 1 metals, the metals in Groups 4, 5, 6, and the Group 8-10 transition metals. If the anode layer is to be light-transmitting, metals in Group 10 and 11, such as Au, Pt, and Ag, or alloys thereof; or mixed-metal oxides of Group 12, 13, and 14 metals, such as indium-tin-oxide (ITO), indium-zinc-oxide (IZO), and the like, may be used. In some embodiments, the anode layer may be an organic material such as polyaniline. The use of polyaniline is described in "Flexible light-emitting diodes made from soluble conducting polymer," Nature, vol. 357, pp. 477-479 (11 Jun. 1992) (the disclosure of which is herein incorporated by reference). Examples of suitable high work function metals and metal oxides include but are not limited to Au, Pt, or alloys thereof; ITO; IZO; and the like. In some embodiments, the anode layer can have a thickness in the range of about 1 nm to about 1000 nm.

A cathode may be a layer including a material having a lower work function than the anode layer. Examples of suitable materials for the cathode layer include those selected from alkali metals of Group 1, Group 2 metals, Group 12 metals including rare earth elements, lanthanides and actinides, materials such as aluminum, indium, calcium, barium, samarium and magnesium, and combinations thereof. Li-containing organometallic compounds, LiF, and Li$_2$O may also be deposited between the organic layer and the cathode layer to lower the operating voltage. Suitable low work function metals include but are not limited to Al, Ag, Mg, Ca, Cu, Mg/Ag, LiF/Al, CsF, CsF/Al or alloys thereof. In an embodiment, the cathode layer can have a thickness in the range of about 1 nm to about 1000 nm.

In some embodiments, the organic component may comprise at least one emissive layer comprising an emissive component, and optionally, a host, such as a compound described herein, a hole-transport material, an electron-transport material, or an ambipolar material. If present, the amount of the host in an emissive layer can vary. In one embodiment, the amount of a host in an emissive layer is in the range of from about 50% to about 99.9% by weight of the emissive layer. In another embodiment, the amount of a host in an emissive layer is in the range of from about 90% to about 99% by weight of the emissive layer. In another embodiment, the amount of a host in an emissive layer is about 97% by weight of the emissive layer. In some embodiments, the mass of the emissive component is about 0.1% to about 10%, about 1% to about 5%, or about 3% of the mass of the emissive layer. In some embodiments, the emissive component comprises a fluorescent compound or a phosphorescent compound.

The light-emitting component or compound may be chosen to vary the color of the light emitted by the light-emitting device. For example, a blue light-emitting component may emit a combination of visible photons so that the light appears to have a blue quality to an observer. In some embodiments, a blue light-emitting component may emit visible photons having an average wavelength in the range of about 440 nm or about 460 nm to about 490 nm or about 500 nm. The "average wavelength" of visible photons may include, when referring to the visible emission spectrum of a compound, the wavelength wherein the area under the curve for the part of the visible spectrum having a lower wavelength than the average wavelength is about equal to the area under the curve for the part of the visible spectrum having a higher wavelength than the average wavelength. Some non-limiting examples of compounds which may form part or all of a blue light-emitting component include iridium coordination compounds such as: bis-{2-[3,5-bis(trifluoromethyl)phenyl]pyridinato-N,C2'}iridium(III)-picolinate, bis(2-[4,6-difluorophenyl]pyridinato-N,C2')iridium (III) picolinate, bis(2-[4,6-difluorophenyl]pyridinato-N,C2')iridium(acetylacetonate), Iridium (III) bis(4,6-difluorophenylpyridinato)-3-(trifluoromethyl)-5-(pyridine-2-yl)-1,2,4-triazolate, Iridium (III) bis (4,6-difluorophenylpyridinato)-5-(pyridine-2-yl)-1H-tetrazolate, bis[2-(4,6-difluorophenyppyridinato-N,C$^{2'}$]iridium (III)tetra(1-pyrazolyl)borate, etc.

bis-{2-[3, 5-
bis(trifluoromethyl)phenyl]pyridinato-
N, C2'}iridium(III)-picolinate
(Ir(CF$_3$ppy)$_2$(Pic)

bis(2-[4, 6-difluorophenyl]pyridinato-
N, C2')iridium (III) picolinate [FIrPic]

bis[2-(4, 6-difluorophenyl)pyridinato-
N, C2']iridium(III)tetra(1-pyrazolyl)borate
(Fir6)

bis(2-[4, 6-difluorophenyl]pyridinato-
N, C2')iridium(acetylacetonate) [FIr(acac)]

Iridium (III) bis(4, 6-difluorophenylpyridinato)-
3-(trifluoromethyl)-5-(pyridine-2-yl)-1, 2, 4-
triazolate (FIrtaz)

Iridium (III) bis(4, 6-
difluorophenylpyridinato)-5-(pyridine-2-
yl)-1H-tetrazolate (FIrN4)

A red light-emitting component may emit a combination of visible photons so that the light appears to have a red quality to an observer. In some embodiments, a red light-emitting component may emit visible photons having an average wavelength in the range of about 600 nm or about 620 nm to about 780 nm or about 800 nm (this is NIR light). Some non-limiting examples of compounds which may form part or all of a red light-emitting component include iridium coordination compounds such as: Bis[2-(2'-benzothienyl)-pyridinato-N,C3']iridium (III)(acetylacetonate); Bis[(2-phenylquinolyl)-N,C2']iridium (III) (acetylacetonate); Bis[(1-phenylisoquinolinato-N,C2')]iridium (III) (acetylacetonate); Bis[(dibenzo[f,h]quinoxalino-N,C2')iridium (III)(acetylacetonate); Tris(2,5-bis-2'-(9',9'-dihexylfluorene)pyridine)iridium (III); Tris[1-phenylisoquinolinato-N,C2']iridium (III); Tris-[2-(2'-benzothienyl)-pyridinato-N,C3']iridium (III); Tris[1-thiophen-2-ylisoquinolinato-N,C3']iridium (III); and Tris[1-(9,9-dimethyl-9H-fluoren-2-yl)isoquinolinato-(N, C3')iridium (III)), etc.

Ir(btp)₂(acac)

Ir(pq)₂(acac)

-continued

Ir(piq)₂(acac)

Ir(DBQ)₂(acac)

Ir(HFP)₃

Ir(piq)₃

-continued

Ir(btp)₃

Ir(tiq)₃

Ir(flil)₃

1. (Btp)₂Ir(III)(acac); Bis[2-(2'-benzothienyl)-pyridinato-N,C3']iridium (III)(acetylacetonate)
2. (Pq)₂Ir(III)(acac); Bis[(2-phenylquinolyl)-N,C2']iridium (III) (acetylacetonate)
3. (Piq)₂Ir(III)(acac); Bis[(1-phenylisoquinolinato-N,C2')]iridium (III) (acetylacetonate)
4. (DBQ)₂Ir(acac); Bis[(dibenzo[f,h]quinoxalino-N,C2')iridium (III)(acetylacetonate)
5. [Ir(HFP)₃], Tris(2,5-bis-2'-(9',9'-dihexylfluorene)pyridine)iridium (III)
6. Ir(piq)₃; Tris[1-phenylisoquinolinato-N,C2']iridium (III)
7. Ir(btp)₃; Tris-[2-(2'-benzothienyl)-pyridinato-N,C3']iridium (III)
8. Ir(tiq)₃, Tris[1-thiophen-2-ylisoquinolinato-N,C3']iridium (III)
9. Ir(fliq)₃; Tris[1-(9,9-dimethyl-9H-fluoren-2-yl)isoquinolinato-(N,C3')iridium (III))

A green light-emitting component may emit a combination of visible photons so that the light appears to have a green quality to an observer. In some embodiments, a green light-emitting component may emit visible photons having an average wavelength in the range of about 490 nm or about 500 nm to about 570 nm or about 600 nm. Some non-limiting examples of compounds which may form part or all of a green light-emitting component include iridium coordination compounds such as: Bis(2-phenylpyridinato-N,C2')iridium(III)(acetylacetonate) [Ir(ppy)$_2$(acac)], Bis(2-(4-tolyl)pyridinato-N,C2')iridium(III)(acetylacetonate) [Ir(mppy)$_2$(acac)], Bis(2-(4-tert-butyl)pyridinato-N,C2')iridium (III) (acetylacetonate) [Ir(t-Buppy)$_2$(acac)], Tris(2-phenylpyridinato-N,C2')iridium (III) [Ir(ppy)$_3$], Bis(2-phenyloxazolinato-N,C2')iridium (III) (acetylacetonate) [Ir(op)$_2$(acac)], Tris(2-(4-tolyl)pyridinato-N,C2')iridium(III) [Ir(mppy)$_3$], etc.

Ir(ppy)$_2$(acac)

Ir(mppy)$_2$(acac)

Ir(t-Buppy)$_2$(acac)

Ir(ppy)$_3$    Ir(mppy)$_3$

Ir(op)$_2$(acac)

An orange light-emitting component may emit a combination of visible photons so that the light appears to have an orange quality to an observer. In some embodiments, an orange light-emitting component may emit visible photons having an average wavelength in the range of about 570 nm or about 585 nm to about 620 nm or about 650 nm. Some non-limiting examples of compounds which may form part or all of an orange light-emitting component include iridium coordination compounds such as: Bis[2-phenylbenzothiazolato-N,C2']iridium (III)(acetylacetonate), Bis[2-(4-tert-butylphenyl)benzothiazolato-N,C2']iridium(III)(acetylacetonate), Bis[(2-(2'-thienyl)pyridinato-N,C3')]iridium (III) (acetylacetonate), Tris[2-(9,9-dimethylfluoren-2-yl)pyridinato-(N,C3')]iridium (III), Tris[2-(9,9-dimethylfluoren-2-yl)pyridinato-(N,C3')]iridium (III), Bis[5-trifluoromethyl-2-[3-(N-phenylcarbzolyl)pyridinato-N,C2']iridium(III) (acetylacetonate), (2-PhPyCz)$_2$Ir(III)(acac), etc.

(bt)$_2$Ir(III)(acac)
Bis[2-phenylbenzothiazolato-N,C2'] iridium (III)(acetylacetonate)

(t-bt)$_2$Ir(III)(acac)
Bis[2-(4-tert-butylphenyl)benzothiazolato-N,C2'] iridium (III)(acetylacetonate)

-continued (thp)₂Ir(III)(acac)
Bis[(2-(2'-thienyl)pyridinato-N,C3'] iridium
(III)(acetylacetonate)

[Ir(Flpy)₃]
Tris[2-(9,9-dimethylfluoren-2-yl)
pyridinato-
(N,C3')]iridium (III)

(Cz-CF₃)Ir(III)(acac)
Bis[5-trifluoromethyl-2-[3-(N-phenylcarbzolyl)pyridinato-
N,C2']iridium
(III)(acetylacetonate)

(2-PhPyCz)₂Ir(III)(acac)

The thickness of an emissive layer may vary. In one embodiment, an emissive layer has a thickness in the range of from about 1 nm to about 150 nm or about 200 nm. The emissive layer may comprise the compound represented by Formula 1 as a host material and any light-emitting component disclosed herein or any other suitable component, wherein the weight ratio of the light-emitting component to the host material may be in a range of about 1% to about 20% or about 5% to about 10%.

In some embodiments, the light-emitting device may emit white light. An emissive layer may be configured to emit white light by including a white light emitter, or a combination of colored emitters which have a combined emission that appears white. Alternatively, a combination of different colored emissive layers may be configured to emit white light.

The thickness of an emissive layer may vary. In one embodiment, an emissive layer has a thickness in the range of from about 1 nm to about 200 nm. In another embodiment, an emissive layer has a thickness in the range of about 1 nm to about 150 nm.

In some embodiments, the organic component may further comprise a hole-transport layer disposed between the anode and the emissive layer. The hole-transport layer may comprise at least one hole-transport material. In some embodiments, the hole-transport material comprises at least one of an aromatic-substituted amine, a carbazole, a polyvinylcarbazole (PVK), e.g. poly(9-vinylcarbazole); polyfluorene; a polyfluorene copolymer; poly(9,9-di-n-octylfluorene-alt-benzothiadiazole); poly(paraphenylene); poly[2-(5-cyano-5-methylhexyloxy)-1,4-phenylene]; a benzidine; a phenylenediamine; a phthalocyanine metal complex; a polyacetylene; a polythiophene; a triphenylamine; an oxadiazole; copper phthalocyanine; 1,1-Bis(4-bis(4-methylphenyl)aminophenyl)cyclohexane; 2,9-Dimethyl-4,7-diphenyl-1,10-phenanthroline; 3,5-Bis(4-tert-butyl-phenyl)-4-phenyl[1,2,4]triazole; 3,4,5-Triphenyl-1,2,3-triazole; 4,4',4"-tris(3-methylphenylphenylamino)triphenylamine (MTDATA); N,N'-bis(3-methylphenyl)N,N'-diphenyl-[1,1'-biphenyl]-4,4'-diamine (TPD); 4,4'-bis[N-(naphthyl)-N-phenyl-amino] biphenyl (α-NPD); 4,4',4"-tris(carbazol-9-yl)-triphenylamine (TCTA); 4,4'-bis[N,N'-(3-tolyl)amino]-3,3'-dimethylbiphenyl (HMTPD); 4,4'-N,N'-dicarbazole-biphenyl (CBP); 1,3-N,N-dicarbazole-benzene (mCP); Bis [4-(p,p'-ditolyl-amino)phenyl]diphenylsilane (DTASi); 2,2'-bis(4-carbazolylphenyl)-1,1'-biphenyl (4CzPBP); N,N'N"-1,3,5-tricarbazoloylbenzene (tCP); N,N'-bis(4-butylphenyl)-N,N'-bis(phenyl)benzidine; or the like.

In some embodiments, the organic component may further comprise an electron-transport layer disposed between the cathode and the emissive layer. In some embodiments, the electron-transport layer may comprise a compound described herein. Other electron-transport materials may be included, such as 2-(4-biphenylyl)-5-(4-tert-butylphenyl)-1,3,4-oxadiazole (PBD); 1,3-bis(N,N-t-butyl-phenyl)-1,3,4-oxadiazole (OXD-7), 1,3-bis[2-(2,2'-bipyridine-6-yl)-1,3,4-oxadiazo-5-yl]benzene; 3-phenyl-4-(1'-naphthyl)-5-phenyl-1,2,4-triazole (TAZ); 2,9-dimethyl-4,7-diphenyl-phenanthroline (bathocuproine or BCP); aluminum tris(8-hydroxyquinolate) (Alq3); and 1,3,5-tris(2-N-phenylbenzimidazolyl)benzene; 1,3-bis[2-(2,2'-bipyridine-6-yl)-1,3,4-oxadiazo-5-yl]benzene (BPY-OXD); 3-phenyl-4-(1'-naphthyl)-5-phenyl-1,2,4- triazole (TAZ), 2,9-dimethyl-4,7-diphenyl-phenanthroline (bathocuproine or BCP); and 1,3,5-tris[2-N-phenylbenzimidazol-z-yl]benzene (TPBI). In one embodiment, the electron transport layer is aluminum quinolate ($Alq_3$), 2-(4-biphenylyl)-5-(4-tert-butylphenyl)-1,3,4-oxadiazole (PBD), phenanthroline, quinoxaline, 1,3,5-tris[N-phenylbenzimidazol-z-yl] benzene (TPBI), or a derivative or a combination thereof.

If desired, additional layers may be included in the light-emitting device. These additional layers may include an electron injection layer (EIL), a hole-blocking layer (HBL), an exciton-blocking layer (EBL), and/or a hole-injection layer (HIL). In addition to separate layers, some of these materials may be combined into a single layer. In some embodiments, the thickness of each of the above layers or any relevant layer may be in a range of a few nm to about 150 nm.

In some embodiments, the light-emitting device can include an electron-injection layer between the cathode layer and the emissive layer. In some embodiments, the electron-injection layer may comprise a compound described herein. Other suitable electron injection materials may also be included, and are known to those skilled in the art. Examples of suitable material(s) that can be included in the electron injection layer include but are not limited to, an optionally substituted compound selected from the following: aluminum quinolate ($Alq_3$), 2-(4-biphenylyl)-5-(4-tert-butylphenyl)-1,3,4-oxadiazole (PBD), phenanthroline, quinoxaline, 1,3,5-tris[N-phenylbenzimidazol-z-yl]benzene (TPBI) a triazine, a metal chelate of 8-hydroxyquinoline such as tris(8-hydroxyquinoliate) aluminum, and a metal thioxinoid compound such as bis(8-quinolinethiolato) zinc. In one embodiment, the electron injection layer is aluminum quinolate ($Alq_3$), 2-(4-biphenylyl)-5-(4-tert-butylphenyl)-1,3,4-oxadiazole (PBD), phenanthroline, quinoxaline, 1,3,5-tris [N-phenylbenzimidazol-z-yl]benzene (TPBI), or a derivative or a combination thereof.

In some embodiments, the device can include a hole-blocking layer, e.g., between the cathode and the emissive layer. Various suitable hole-blocking materials that can be included in the hole-blocking layer are known to those skilled in the art. Suitable hole-blocking material(s) include but are not limited to, an optionally substituted compound selected from the following: bathocuproine (BCP), 3,4,5-triphenyl-1,2,4-triazole, 3,5-bis(4-tert-butyl-phenyl)-4-phenyl-[1,2,4]triazole, 2,9-dimethyl-4,7-diphenyl-1,10-phenanthroline, and 1,1-bis (4-bis(4-methylphenyl)aminophenyl)-cyclohexane.

In some embodiments, the light-emitting device can include an exciton-blocking layer, e.g., between the emissive layer and the anode. In an embodiment, the band gap of the material(s) that comprise an exciton-blocking layer is large enough to substantially prevent the diffusion of excitons. A number of suitable exciton-blocking materials that can be included in the exciton-blocking layer are known to those skilled in the art. Examples of material(s) that can compose an exciton-blocking layer include an optionally substituted compound selected from the following: aluminum quinolate ($Alq_3$), 4,4'-bis[N-(naphthyl)-N-phenyl-amino]biphenyl (α-NPD), 4,4'-N,N'-dicarbazole-biphenyl (CBP), and bathocuproine (BCP), and any other material(s) that have a large enough band gap to substantially prevent the diffusion of excitons.

In some embodiments, the light-emitting device can include a hole-injection layer, e.g., between the emissive layer and the anode. Various suitable hole-injection materials that can be included in the hole-injection layer are known to those skilled in the art. Exemplary hole-injection material(s) include an optionally substituted compound selected from the following: a polythiophene derivative such as poly(3,4-ethylenedioxythiophene (PEDOT)/polystyrene sulphonic acid (PSS), a benzidine derivative such as N,N,N',N'-tetraphenyl-benzidine, poly(N,N'-bis(4-butylphenyl)-N,N'-bis(phenyl) benzidine), a triphenylamine or phenylenediamine derivative such as N,N'-bis(4-methylphenyl)-N,N'-bis(phenyl)-1,4-phenylenediamine, 4,4',4"-tris(N-(naphthylen-2-yl)-N-phenyl amino)triphenylamine, an oxadiazole derivative such as 1,3-bis(5-(4-diphenylamino)phenyl-1,3,4-oxadiazol-2-yl) benzene, a polyacetylene derivative such as poly(1,2-bis-benzylthio-acetylene), and a phthalocyanine metal complex derivative such as phthalocyanine copper. Hole-injection materials, while still being able to transport holes, may have a hole mobility substantially less than the hole mobility of conventional hole transport materials.

Light-emitting devices comprising the compounds described herein can be fabricated using techniques known in the art, as informed by the guidance provided herein. For example, a glass substrate can be coated with a high work functioning metal such as ITO which can act as an anode. After patterning the anode layer, a hole-injection and/or hole-transport layer may be deposited on the anode in that order. An emissive layer that includes an emissive component, can be deposited on the anode, the hole-transport, or the hole-injection layer. The emissive layer may contain a compound described herein, and/or a compound described herein may be part of an electron-transport layer and/or an electron-injecting layer, deposited in that order, or may be part of an electron-injecting and electron-transport layer. The cathode layer, comprising a low work functioning metal (e.g., Mg:Ag), can then be deposited, e.g., vapor evaporated. The device may also contain an exciton-blocking layer, an electron-blocking layer, a hole-blocking layer, a second emissive layer, or other layers that can be added to the device using techniques known in the art, as informed by the guidance provided herein.

In some embodiments, the OLED is configured by a wet process such as a process that comprises at least one of spraying, spin coating, drop casting, inkjet printing, screen printing, etc. Some embodiments provide a composition which is a liquid suitable for deposition onto a substrate. The liquid may be a single phase, or may comprise one or more additional solid or liquid phases dispersed in it. The liquid typically comprises a light-emitting compound, a host material described herein, and a solvent.

The present invention will be explained in detail with reference to specific examples which are not intended to limit the present invention. In the examples where conditions and/or structures are not specified, the skilled artisan in the art can readily provide such conditions and/or structures, in view of the present disclosure, as a matter of routine experimentation. The numerical numbers applied in specific examples may be modified by a range of at least ±50%, wherein the endpoints of the ranges may be included or excluded.

Example 1

Example of Synthesis

Example 1.1

Synthesis of Compound 1

1,3-dibromo-5-methylbenzene (5.0 g, 20.0 mmol), bis(pinacolato)diboron (11.3 g, 44.4 mmol), Pd(dppf)Cl$_2$ (1.6 g, 2.2 mmol), and potassium acetate (13.3 g, 136.0 mmol) were dissolved in 75 mL of 1,4-dioxane. The reaction mixture was degassed with argon and then heated to about 85° C. under argon for about 18 hours. The reaction mixture was filtered and an extraction was performed in ethyl acetate. The organic phase was washed with water and then brine, then dried over magnesium sulfate, filtered, and concentrated. The resulting residue was purified by a silica gel column with 1:4 ethyl acetate:hexanes as the eluent to yield the product as an off-white solid (Compound 1, 58%).

Example 1.2

Synthesis of Compound 2

Carbazole (17.6 g, 105.5 mmol), 3,5-dibromopyridine (75.0 g, 316.6 mmol), potassium carbonate (58.4 g, 422.2 mmol), copper (4.5 g, 70.4 mmol), and 18-crown-6 (9.3 g, 35.2 mmol) were dissolved in 450 mL of 1,2-dichlorobenzene. The reaction mixture was degassed with argon and then heated to about 200° C. under argon for about 18 hours. The reaction mixture was filtered and the solvent was removed. The resulting residue was purified by a silica gel column with 1:9 dichloromethane:hexanes as the eluent to yield the product as a white solid (Compound 2, 82%).

Example 1.3

Synthesis of Compound 3

Compound 1 (1.6 g, 4.7 mmol), Compound 2 (3.0 g, 9.3 mmol), Pd(PPh$_3$)$_4$ (0.5 g, 0.5 mmol), and potassium carbonate (2.8 g, 20.4 mmol) were dissolved in a 5:1 ratio of 1,4-dioxane (40 mL) and water (8 mL). The reaction mixture was degassed with argon and then heated to about 95° C. under argon for about 22 hours. The reaction mixture was filtered and an extraction was performed in ethyl acetate. The organic phase was washed with water and brine. The extract was dried over sodium sulfate, filtered and concentrated. The resulting residue was purified by a silica gel column with 1:4 ethyl acetate:hexanes as the eluent. The solvents were removed and the product was recrystallized from dichloromethane/hexanes to yield the product as an off-white solid (Compound 3, 73%). Compound 3 was confirmed as follows:

$^1$H NMR (400 MHz, CDCl$_3$): δ 8.99 (d, J=2.2 Hz, 2H). 8.89 (d, J=2.2 Hz, 2H), 8.15 (d, J=9.5 Hz, 6H), 7.69 (s, 1H), 7.53 (s, 2H), 7.43 (d, J=4.4 Hz, 8H), 7.34-7.30 (m, 3H), 7.24 (s, 1H), 2.53 (s, 3H)

LCMS (m/e$^+$) calcd for C$_{41}$H$_{28}$N$_4$: 577; found: 577

Example 1.4

Synthesis of Compound 4

1,3-dibromobenzene (2.5 g, 10.6 mmol), bis(pinacolato)diboron (6.0 g, 23.5 mmol), Pd(dppf)$_2$Cl$_2$ (0.9 g, 1.2 mmol), and potassium acetate (7.1 g, 72.1 mmol) were dissolved in 50 mL of 1,4-dioxane. The reaction mixture was degassed with argon and then heated to 85° C. under argon for 18 hours. The reaction mixture was filtered and an extraction was performed in ethyl acetate. The organic phase was washed with water and brine. The extract was dried over sodium sulfate, filtered, and concentrated. The resulting residue was purified by a silica gel column with 1:9 ethyl acetate:hexanes as the eluent. The solvents were removed and the product was recrystallized from dichloromethane/methanol to yield the product Compound 4 as an off-white solid (86%).

Synthesis of Compound 5

Compound 4 (1.6 g, 4.8 mmol), compound 2 (3.1 g, 9.7 mmol), Pd(PPh$_3$)$_4$ (0.6 g, 0.5 mmol), and potassium carbonate (3 g, 21.7 mmol) were dissolved in a 5:1 ratio of 1,4-dioxane (40 mL) and water (8 mL). The reaction mixture was degassed with argon and then heated to about 95° C. under argon for about 22 hours. The reaction mixture was extracted with dichloromethane and washed with water and brine. The extract was dried over sodium sulfate, filtered and concentrated. The resulting residue was purified by a silica gel column with 1:4 ethyl acetate:hexanes as the eluent. The solvents were removed and the product was recrystallized from dichloromethane/hexanes to yield the product as an off-white solid (Compound 5, 60%). Compound 5 was confirmed as follows:

$^1$H NMR (400 MHz, CDCl$_3$): δ 9.0 (d, J=2.2 Hz, 2H), 8.91 (d, J=2.2 Hz, 2H), 8.17-8.14 (m, 6H), 7.89 (s, 1H), 7.75 (t, J=1.8 Hz, 1H), 7.73 (d, 1.4 Hz, 1H), 7.68 (dd, J$_1$=6.2 Hz, J$_2$=8.8 Hz, 1H), 7.43 (d, J=4.4 Hz, 8H), 7.36-7.31 (m, 4H). LCMS (m/e) calcd for C$_{40}$H$_{26}$N$_4$: 563, found 563

Example 2

Device Fabrication

Fabrication of Light-Emitting Device: UU

Figure 2:
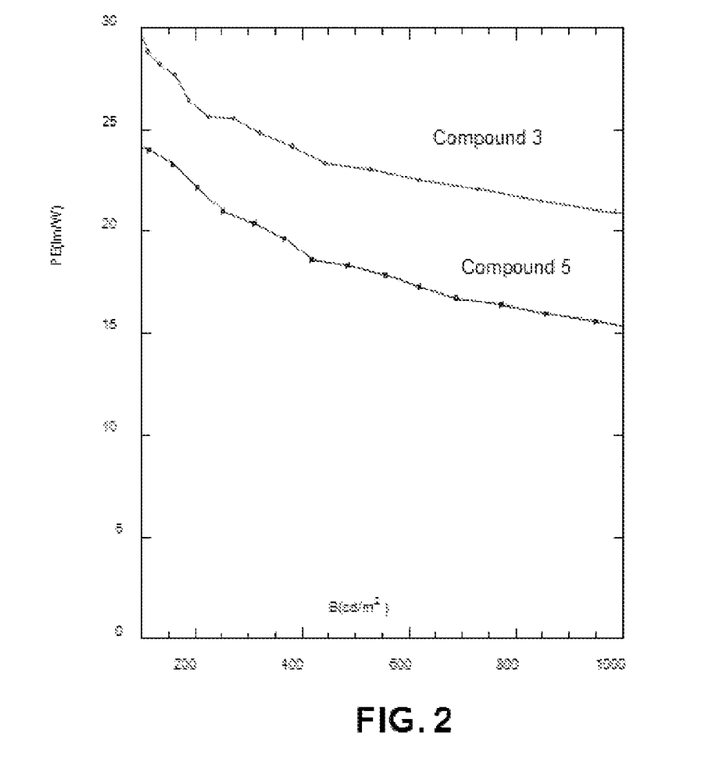
FIG. 2 shows the device power efficiency as a function of device brightness of an embodiment of a device of FIG. 1.

A device was fabricated in the following manner. ITO substrates having a sheet resistance of about 14 ohm/sq were cleaned ultrasonically and sequentially in detergent, water, acetone and then IPA; and then dried in an oven at about 80° C. for about 30 min under ambient environment. The substrates were then baked at about 200° C. for about 1 hour in an ambient environment, then under UV-ozone treatment for about 30 minutes. PEDOT:PSS (hole-injection material) was then spin-coated on the annealed substrate at about 5000 rpm for about 30 sec. The coated layer was then baked at about 100° C. for 30 min in an ambient environment, followed by baking at 200° C. for 30 min inside a glove box (N$_2$ environment). The substrate was then transferred into a vacuum chamber, where 4,4',4"-tri(N-carbazolyl)triphenylamine (TCTA [hole transporting material]) was vacuum deposited at a rate of about 0.1 nm/s rate under a base pressure of about $2\times10^{-7}$ ton. Bis[2-(4,6'-difluorophenyl)pyridinato-N, C.sup.2']iridium(picolinate) ("FIrpic") (10 wt %) was co-deposited as an emissive layer with Compound 3 host material at about 0.01 nm/s and about 0.10 nm/s, respectively, to make the appropriate thickness ratio. 1,3,5-Tris(1-phenyl-1H-benzimidazol-)-2-yl)benzene (TPBI) was then deposited at about 0.1 nm/s rate on the emissive layer. A layer of lithium fluoride (LiF) (electron injection material) was deposited at about 0.005 nm/s rate followed by deposition of the cathode as Aluminum (Al) at about 0.3 nm/s rate. The representative device structure was: ITO (about 150 nm thick)/PEDOT:PSS (about 40 nm thick)/TCTA (about 40 nm thick)/Compound 3:FIrpic (about 30 nm thick)/TPBI (about 30 nm thick)/LiF (about 0.5 nm thick)/Al (about 100 nm thick). The device was then encapsulated with a glass cap to cover the emissive area of the OLED device in order to protect it from moisture, oxidation or mechanical damage. Additional devices were prepared in the same manner, using Compound 5 in place of Compound 3. Each individual device had an area of about 0.14 cm$^2$. The devices made in the above described manner displayed a device efficiency of about 21 lm/W (device with Compound 3, 1000 cd/m2) and about 16 lm/W (device with Compound 5, 1000 cd/m$^2$). FIG. 2 illustrates the power efficiency (lm/W) of the devices as a function of ["B" cd/m$^2$].

The above examples are non-optimized monocolor blue devices without any light outcoupling enhancement. Once incorporated with other colors such as green and red that intrinsically have higher efficiency, the light-emitting devices will achieve high power efficiency (PE) in optimized white OLED devices (e.g., a PE of over 100 lm/W at 1000 cd/m$^2$).

Figure 1:
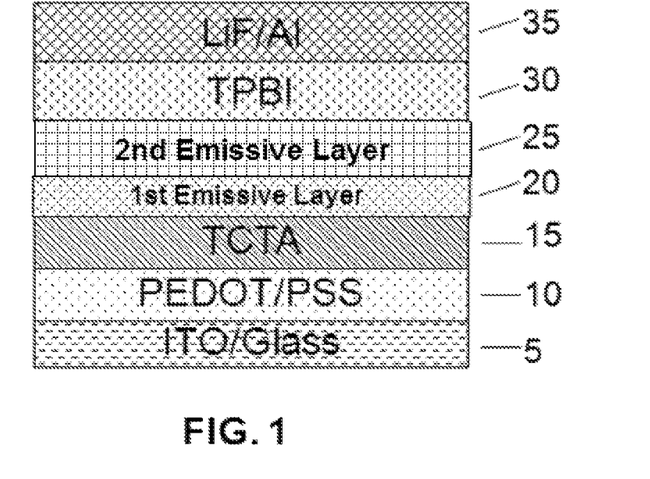
FIG. 1 depicts an exemplary configuration of an embodiment of a device described herein.

An exemplary configuration of the device comprising a compound described herein is shown in FIG. 1. The device comprises the following layers in the order given: an ITO anode 5, a PEDOT hole-injection layer 10, a hole-transport layer 15, a first emissive layer 20, a second emissive layer 25, an electron-transport layer 30, and a LiF/Al cathode 35. The first emissive layer 20 (which was not used in the above example) may be any conventional or suitable emissive layer (such as those disclosed in a co-pending U.S. patent application Ser. No. 13/016,665, the disclosure of which is incorporated herein by reference in its entirety). The second emissive layer 25 comprises a compound described herein (e.g., Compound 3: FIrpic) and a yellow or red light-emitting component.

Although the claims have been explained in the context of certain preferred embodiments and examples, it will be understood by those skilled in the art that the present claims extends beyond the specifically disclosed embodiments to other alternative embodiments and/or uses and obvious modifications and equivalents thereof. Thus, it is intended that the scope of the present claims should not be limited by the particular disclosed embodiments described above.

What is claimed is:

1. A compound which has a formula selected from:

2. An organic light-emitting device comprising: an organic component disposed between an anode and a cathode for emitting light; wherein the organic component comprises an emissive component and a compound represented by the formula:

wherein R$^1$, R$^2$, R$^3$, and R$^4$ are independently selected from H, —CH$_1$, and —C$_2$H$_3$; and Bz$^1$ and Bz$^2$ are independently selected from optionally substituted carbazolyl, optionally substituted diphenylamine, and optionally substituted phenylnaphthylamine.

3. The organic light-emitting device according to claim 2, wherein the compound included in the organic component has a formula:

wherein $R^1$, $R^2$, $R^3$, and $R^4$ are independently selected from H and —$CH_3$.

4. The organic light-emitting device according to claim 3, wherein the formula of the compound, $R^1$, $R^2$, $R^3$, and $R^4$ are H.

5. The organic light-emitting device according to claim 3, wherein the formula of the compound, $R^1$, $R^2$, $R^3$, and $R^4$ are H.

6. The organic light-emitting device according to claim 3, wherein the compound included in the organic component has a formula selected from:

7. The composition comprising a compound according to claim 1 as a host material and a fluorescent compound or phosphorescent compound as an emissive component.

8. The composition of claim 7, wherein the fluorescent compound or phosphorescent compound is selected from the group consisting of: bis-{2-[3,5-bis(trifluoromethyl)phenyl] pyridinato-N,C2'}iridium (III)-picolinate, bis(2-[4,6-difluorophenyl]pyridinato-N,C2')iridium (III) picolinate, bis(2-[4,6-difluorophenyl]pyridinato-N,C2')iridium (acetylacetonate), Iridium (III) bis(4,6-difluorophenylpyridinato)-3-(trifluoromethyl)-5-(pyridine-2-yl)-1,2,4-triazolate, Iridium (III) bis(4,6-difluorophenylpyridinato)-5-(pyridine-2-yl)-1H-tetrazolate, bis[2-(4,6-difluorophenyl)pyridinato-N,C$^{2'}$]iridium(III)tetra (1-pyrazolyl)borate, Bis[2-(2'-benzothienyl) -(acetylacetonate); Bis[(1-phenylisoquinolinato-N,C2')]iridium (III) (acetylacetonate); Bis[(dibenzo[f,h]quinoxalino-N,C2')] iridium (III)(acetylacetonate); Tris(2,5-bis-2'-(9',9'-dihexylfluorene)pyridine)iridium (III); Tris[1-phenylisoquinolinato-N,C2']iridium (III); Tris-[2(2'-benzothienyl)-pyridinato-N,C3']iridium (III); Tris[1-thiophen-2-ylisoquinolinato-N,C3']iridium (III); and Tris[1-(9,9-dimethyl-9H-fluoren-2-yl)isoquinolinato-(N,C3') iridium (III)), Bis(2-phenylpyridinato-N,C2')iridium(III) (acetylacetonate) [Ir(ppy)$_2$(acac)], Bis(2-(4-tolyl)pyridinato-N,C2')iridium(III)(acetylacetonate) [Ir(mppy)$_2$(acac)], Bis (2-(4-tert-butyl)pyridinato-N,C2')iridium (III) (acetylacetonate) [Ir(t-Buppy)$_2$(acac)], Tris(2-phenylpyridinato-N,C2')iridium (III) [Ir(ppy)$_3$], Bis(2-phenyloxazolinato-N,C2')iridium (III) (acetylacetonate) [Ir (op)$_2$(acac)], Tris(2-(4-tolyl)pyridinato-N,C2')iridium(III) [Ir(mppy)$_3$], Bis[2-phenylbenzothiazolato-N,C2']iridium (III)(acetylacetonate), Bis[2-(4-tert-butylphenyl)benzothiazolato-N,C2']iridium(III)(acetylacetonate), Bis[(2-(2'-thienyl)pyridinato-N,C3')]iridium (III) (acetylacetonate), Tris[2-(9,9-dimethylfluoren-2-yl)pyridinato-(N,C3')]iridium (III), Tris[2-(9,9-dimethylfluoren-2-yl)pyridinato-(N,C3')]iridium (III), Bis[5-trifluoromethyl-2-[3-(N-phenylcarbzolyl) pyridinato-N,C2']iridium(III)(acetylacetonate), (2-PhPy Cz)$_2$Ir(III)(acac), and combinations of any two or more of the foregoing.

9. The composition of claim 7, wherein the compound as a host material is

10. The composition of claim 7, wherein the fluorescent compound or phosphorescent compound is bis(2-[4,6-difluorophenyl]pyridinato-N,C2')irridium(III) picolinate.

* * * * *

UNITED STATES PATENT AND TRADEMARK OFFICE
CERTIFICATE OF CORRECTION

PATENT NO. : 8,895,157 B2  
APPLICATION NO. : 13/360639  
DATED : November 25, 2014  
INVENTOR(S) : Shijun Zheng, Rebecca Romero and David T. Sisk It is certified that error appears in the above-identified patent and that said Letters Patent is hereby corrected as shown below:

In the Claims

At column 30, line 50 in Claim 2, after the phrase "represented by", delete "the" and insert therefor --a--.

At column 30, line 64 in Claim 2, delete "$CH_1$" and insert therefor --$CH_3$--.

At column 30, line 64 in Claim 2, delete "$C_2H_3$" and insert therefor --$C_2H_5$--.

At column 31, line 19 in Claim 4, between "wherein" and "the", insert --in--.

At column 31, line 22 in Claim 5, between "wherein" and "the", insert --in--.

At column 31, line 22 in Claim 5, between "$R^1$" and ",", insert --is methyl--.

At column 31, line 22 in Claim 5, between "," and "$R^2$", insert --and--.

At column 31, line 45 in Claim 7, delete "The" and insert therefor --A--.

At column 32, line 8 in Claim 8, between "Bis[2-(2'-benzothienyl)-" and "(acetylaceto-", please insert --pyridinato-N,C3']iridium (III)(acetylacetonate); Bis[(2-phenylquinolyl)-N,C2']iridium (III)--.

At column 32, line 13 in Claim 8, delete "Tris-[2(2'" and insert therefor --Tris-[2-(2'--.

At column 32, line 50 in Claim 10, delete "irridium" and insert therefor --iridium--.

Signed and Sealed this  
Thirty-first Day of March, 2015

Michelle K. Lee  
*Director of the United States Patent and Trademark Office*